(12) United States Patent
Katou et al.

(10) Patent No.: US 8,975,161 B2
(45) Date of Patent: Mar. 10, 2015

(54) DICING/DIE BONDING INTEGRAL FILM, DICING/DIE BONDING INTEGRAL FILM MANUFACTURING METHOD, AND SEMICONDUCTOR CHIP MANUFACTURING METHOD

(75) Inventors: Rie Katou, Ichihara (JP); Takayuki Matsuzaki, Ichihara (JP); Shinya Katou, Ichihara (JP); Ryoji Furutani, Ichihara (JP); Tatsuya Sakuta, Ichihara (JP); Kouji Komorida, Ichihara (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 75 days.

(21) Appl. No.: 13/809,816

(22) PCT Filed: Jul. 13, 2011

(86) PCT No.: PCT/JP2011/065986
§ 371 (c)(1),
(2), (4) Date: Feb. 12, 2013

(87) PCT Pub. No.: WO2012/008491
PCT Pub. Date: Jan. 19, 2012

(65) Prior Publication Data
US 2013/0143390 A1 Jun. 6, 2013

(30) Foreign Application Priority Data
Jul. 13, 2010 (JP) ................................ P2010-159030

(51) Int. Cl.
*H01L 21/00* (2006.01)
*H01L 21/683* (2006.01)
(Continued)

(52) U.S. Cl.
CPC ...... *H01L 21/6836* (2013.01); *H01L 21/67092* (2013.01); *H01L 21/67132* (2013.01);
(Continued)

(58) Field of Classification Search
USPC .................................................. 438/460–464
See application file for complete search history.

(56) References Cited

U.S. PATENT DOCUMENTS 5,882,956 A * 3/1999 Umehara et al. .............. 438/114

FOREIGN PATENT DOCUMENTS

| CN | 101523561 | 9/2009 |
| CN | 101627465 | 1/2010 |

(Continued)

OTHER PUBLICATIONS

Machine translation of JP 2008-211224.*

(Continued)

*Primary Examiner* — Richard Booth
(74) *Attorney, Agent, or Firm* — Antonelli, Terry & Kraus, LLP.

(57) ABSTRACT

A dicing/die bonding integral film of the present invention includes a base film, a pressure-sensitive adhesive layer which is formed on the base film and to which a wafer ring for blade dicing is bonded, and a bonding layer formed on the adhesive layer and having a central portion to which a semiconductor wafer to be diced is bonded, wherein a planar shape of the bonding layer is circular, an area of the bonding layer is greater than an area of the semiconductor wafer and smaller than an area of each of the base film and the adhesive layer, and a diameter of the bonding layer is greater than a diameter of the semiconductor wafer and less than an inner diameter of the wafer ring, and a difference in diameter between the bonding layer and the semiconductor wafer is greater than 20 mm and less than 35 mm.

10 Claims, 10 Drawing Sheets

(51) Int. Cl.
  *H01L 21/67* (2006.01)
  *H01L 21/78* (2006.01)
  *C09J 7/02* (2006.01)
(52) U.S. Cl.
  CPC . *H01L21/78* (2013.01); *C09J 7/02* (2013.01); *H01L 2221/68327* (2013.01); *H01L 2221/68377* (2013.01); *C09J 2201/606* (2013.01); *C09J 2201/61* (2013.01); *C09J 2203/326* (2013.01); *C09J 2201/36* (2013.01)
  USPC .......................................... 438/460; 438/462

(56) References Cited

FOREIGN PATENT DOCUMENTS

| | | |
|---|---|---|
| JP | 59-177942 | 10/1984 |
| JP | 2-32181 | 2/1990 |
| JP | 08-213349 | 8/1996 |
| JP | 10-330441 | 12/1998 |
| JP | 2002-158276 | 5/2002 |
| JP | 2002-226796 | 8/2002 |
| JP | 2006-213872 | 8/2006 |
| JP | 2006-225567 | 8/2006 |
| JP | 2006-232985 | 9/2006 |
| JP | 2006-237465 | 9/2006 |
| JP | 2007-123914 | 5/2007 |
| JP | 2008-211224 | 9/2008 |
| JP | 2009-032799 | 2/2009 |
| JP | 2009-094127 | 4/2009 |
| JP | 2011-142206 | 7/2011 |
| KR | 10-2006-0061828 | 6/2006 |
| TW | 327250 | 2/1998 |
| TW | 200842174 A | 11/2008 |
| WO | WO 2008/105169 A | 9/2008 |
| WO | WO 2009/131405 | 10/2009 |

OTHER PUBLICATIONS

International Search Report for PCT/JP2011/0650986 mailed Aug. 9, 2011.
International Search Report for PCT/JP 2008/000343 mailed May 27, 2008.
Office Action from Republic of China, Taiwan Patent Office in a corresponding patent application No. 100124757 dated Dec. 26, 2013, 6 pages in Chinese.
Office Action from Korean Patent Office in counterpart Korean Patent Application No. 10-2013-7003315, mailed Dec. 12, 2013, pp. 1-2.
Office Action from Japanese Patent Office in a corresponding patent application No. 2012-524577 dated May 20, 2014, 3 pp.
Chinese Official Action dated Jan. 7, 2015, for CN Application No. 201180034409.X.

* cited by examiner

DICING/DIE BONDING INTEGRAL FILM, DICING/DIE BONDING INTEGRAL FILM MANUFACTURING METHOD, AND SEMICONDUCTOR CHIP MANUFACTURING METHOD

TECHNICAL FIELD

The present invention relates to a dicing/die bonding integral film for blade dicing, a dicing/die bonding integral film manufacturing method, and a semiconductor chip manufacturing method.

BACKGROUND ART

In the past, paste-like bonding agents have been mainly used to bond semiconductor chips and semiconductor chip supporting members. However, when paste-like bonding agents were used, there were problems such as defects in which the adhesives exuded out from semiconductor chips or the semiconductor chips were bonded at an angle, and difficulty in controlling a thickness of the film made of the paste-like adhesives.

In order to solve these problems, film-like bonding agents have recently received attention as a possible replacement for paste-like bonding agents (for example, see Patent Literatures 1 to 3 below). As a method of using these film-like bonding agents, there is a wafer rear side attachment method. In the wafer rear side attachment method, a film-like bonding layer is attached to a rear side of a semiconductor wafer first, and then a base sheet for dicing in which an adhesive layer is formed is attached to the other side of the bonding layer. Thereafter, a semiconductor wafer is diced to obtain individually divided semiconductor chips. The individually divided semiconductor chips are picked up and transferred to a bonding step. Therefore, the adhesive layer of the base sheet for dicing requires an adhesive strength sufficient to prevent the bonding layer from being scattered by the load created by the cutting of the semiconductor wafer, and also requires that, during picking up of semiconductor chips, adhesive residue is not present in each semiconductor chip and the semiconductor chip bonded to the bonding layer can be easily picked up.

Also, a dicing tape used for the wafer rear side attachment method includes a UV-type tape and a pressure-sensitive-type tape. A UV-type dicing tape has an adhesive strength required for dicing before UV irradiation but which allows semiconductor chips to be detached so as to be easily picked up after UV irradiation. In the case where a pressure-sensitive dicing tape is used, UV irradiation is unnecessary. However, the tape should have a combination of opposite adhesive characteristics so as to have the adhesive strength required in dicing and also have the adhesive strength weak enough to allow semiconductor chips to be easily picked up.

CITATION LIST

Patent Literature

[Patent Literature 1] Japanese Unexamined Patent Application Publication No. 2002-226796

[Patent Literature 2] Japanese Unexamined Patent Application Publication No. 2002-158276

[Patent Literature 3] Japanese Unexamined Patent Application Publication HEI No. 2-32181

SUMMARY OF INVENTION

Technical Problem

A dicing/die bonding integral film in which the film-like bonding layer and the base sheet for dicing are integrated has been known. In such a dicing/die bonding integral film, a bonding layer, an adhesive layer, and a base sheet for dicing are formed on a long peelable base in that order, and the bonding layer is pre-cut (previously cut) to be larger than a semiconductor wafer.

However, in a dicing process, cutting water is sprayed onto a dicing blade and a semiconductor wafer in order to reduce frictional heat generated between the semiconductor wafer and the dicing blade rotating at high speed. However, there is the problem in that when an adhesion between a bonding layer and an adhesive layer is weak, a peripheral edge of the bonding layer which is pre-cut to be larger than the semiconductor wafer as described above is peeled off because it cannot endure the load/hydraulic pressure from the cutting water. The thus-peeled bonding layer may cause the semiconductor wafer to be contaminated.

The present invention is made to solve the above-described problems, and an object of the present invention is to provide a dicing/die bonding integral film for preventing a peripheral edge of a bonding layer from being peeled from an adhesive layer during a dicing step, a dicing/die bonding integral film manufacturing method, and a semiconductor chip manufacturing method.

Solution to Problem

To solve the problems above, a dicing/die bonding integral film according to the present invention includes: a base film; a pressure-sensitive adhesive layer which is formed on the base film and to which a wafer ring to be used in blade dicing is bonded; and a bonding layer formed on the adhesive layer and having a central portion to which a semiconductor wafer to be subjected to blade dicing is bonded, wherein a planar shape of the bonding layer is circular, an area of the bonding layer is greater than an area of the semiconductor wafer and smaller than an area of each of the base film and the adhesive layer, and a diameter of the bonding layer is greater than a diameter of the semiconductor wafer and less than an inner diameter of the wafer ring, and a difference in diameter between the bonding layer and the semiconductor wafer is greater than 20 mm and less than 35 mm.

In the dicing/die bonding integral film, a difference in diameter between the bonding layer and the semiconductor wafer is greater than 20 mm and less than 35 mm. In general, since the inner diameter of a wafer ring is greater than the diameter of the semiconductor wafer by 35 mm or more, the bonding layer is contained inside a hole of the wafer ring. Also, a peripheral edge of the bonding layer exudes out from the semiconductor wafer by 10 mm or more when the semiconductor wafer is bonded to a central portion of the bonding layer. For this reason, cutting water, which is sprayed onto a dicing blade and the semiconductor wafer, is prevented from directly contacting the peripheral edge of the bonding layer when the semiconductor wafer is diced. Therefore, it is possible to prevent the peeling of the peripheral edge of the bonding layer which is caused by the load or hydraulic pressure from the cutting water during dicing.

A dicing/die bonding integral film manufacturing method according to the present invention includes: a dicing film preparation step of preparing a dicing film in which an adhesive layer is formed on a base film; a die bonding film preparation step of preparing a die bonding film in which a bonding layer is formed on a peelable base; a bonding layer cutting step of cutting the bonding layer into a circular shape such that an area of the bonding layer is greater than an area of a semiconductor wafer bonded to a central portion of the bonding layer and is smaller than an area of each of the adhesive layer and the base film; and a film bonding step of bonding a side of the dicing film, at which the adhesive layer is formed, to the peelable base of the die-bonding film and the bonding layer cut into the circular shape, wherein, in the bonding layer cutting step, the bonding layer is cut such that a diameter of the bonding layer is greater than a diameter of the semiconductor wafer and less than an inner diameter of a wafer ring to be used in blade dicing, and a difference in diameter between the bonding layer and the semiconductor wafer is greater than 20 mm and less than 35 mm.

In the dicing film preparation step, it is desirable that a dicing film in which a pressure-sensitive adhesive layer is formed on a base film is prepared.

According to the dicing/die bonding integral film method, a difference in diameter between the bonding layer and the semiconductor wafer is greater than 20 mm and less than 35 mm. In general, since the inner diameter of the wafer ring is greater than the diameter of the semiconductor wafer by 35 mm or more, the bonding layer is contained inside a hole of the wafer ring. Also, a peripheral edge of the bonding layer exudes out from the semiconductor wafer by 10 mm or more when the semiconductor wafer is bonded to a central portion of the bonding layer. Therefore, cutting water, which is sprayed onto the dicing blade and the semiconductor wafer, is prevented from directly contacting the peripheral edge of the bonding layer when the semiconductor wafer is diced. Therefore, it is possible to prevent the peeling of the peripheral edge of the bonding layer which is caused by the load or hydraulic pressure from the cutting water during dicing.

Also, a semiconductor chip manufacturing method according to the present invention includes: a semiconductor wafer bonding step of bonding a semiconductor wafer to a bonding layer of a dicing/die bonding integral film in which an adhesive layer is formed on a base film and the bonding layer is formed on the adhesive layer, such that a peripheral edge of the bonding layer exudes out from around the entire the semiconductor wafer by 10 mm or more; a semiconductor wafer bonding step of bonding a wafer ring to the adhesive layer outside the peripheral edge of the bonding layer; and a chip obtaining step of obtaining a plurality of semiconductor chips which are individually divided by dicing the semiconductor wafer with a blade.

According to the semiconductor chip manufacturing method, the bonding layer is contained inside a hole of the wafer ring, and the peripheral edge of the bonding layer exudes out from around the entire semiconductor wafer by 10 mm or more. Therefore, cutting water, which is sprayed onto the dicing blade and the semiconductor wafer, is prevented from directly contacting the peripheral edge of the bonding layer when the semiconductor wafer is diced. Thus, it is possible to prevent the peeling of the peripheral edge of the bonding layer which is caused by hydraulic pressure from the cutting water during dicing. Consequently, it is possible to obtain a semiconductor chip with low contamination caused by the peeling of the bonding layer.

Advantageous Effects of Invention

According to the present invention, there are provided a dicing/die bonding integral film for preventing a peripheral edge of a bonding layer from being peeled from an adhesive layer during dicing of a semiconductor wafer, a dicing/die bonding integral film manufacturing method, and a semiconductor chip manufacturing method.

DESCRIPTION OF EMBODIMENTS

Hereinafter, preferred embodiments of a semiconductor chip manufacturing method and a processing film according to the present invention will be described in detail with reference to drawings.

Figure 1:
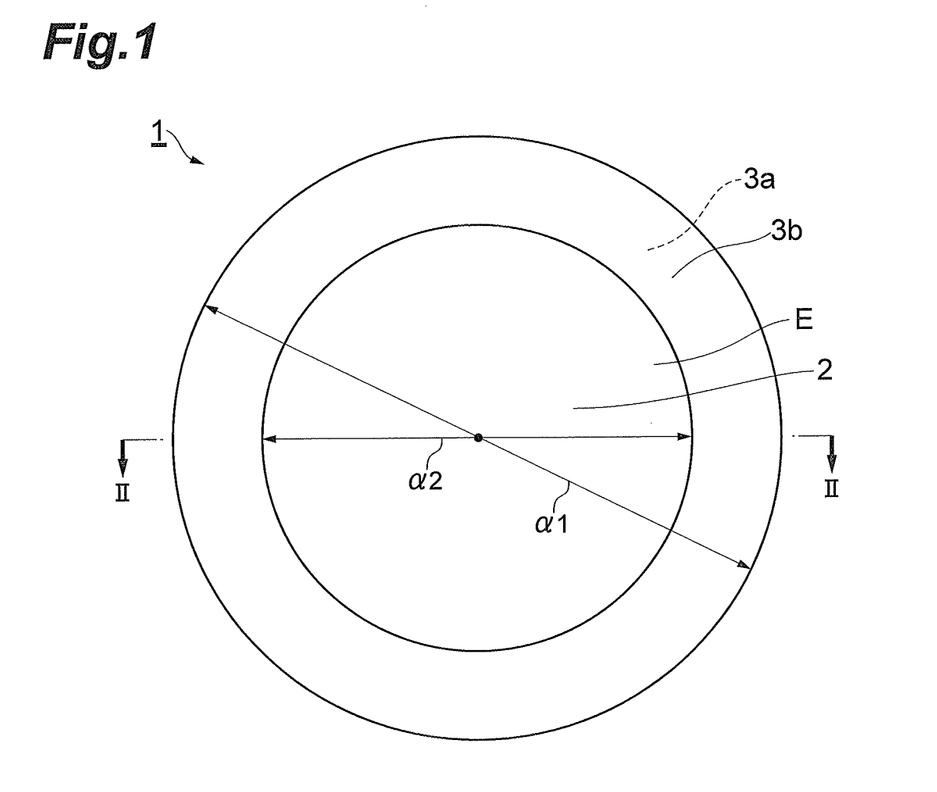
FIG. 1 is a view illustrating an embodiment of a dicing/die bonding integral film according to the present invention.
Figure 2:
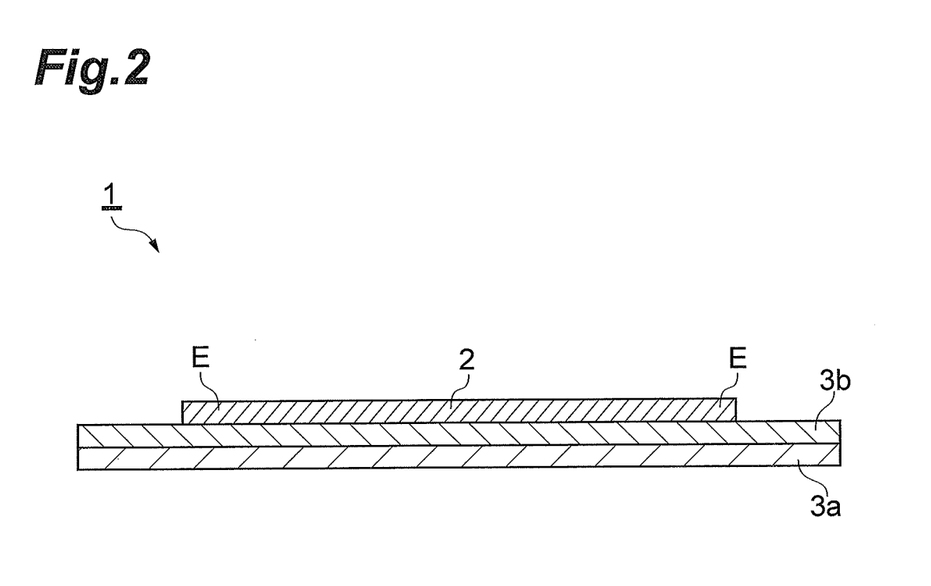
FIG. 2 is a cross-sectional view taken along line II-II of FIG. 1.

FIG. 1 is a view illustrating an embodiment of a dicing/die bonding integral film 1 according to the present invention. FIG. 2 is a cross-sectional view taken along line II-II of FIG. 1.

The dicing/die bonding integral film 1 is a film which integrally has a function as a dicing film for individually dividing a semiconductor wafer into semiconductor chips and a function of providing a bonding layer to the semiconductor chips when the individually divided semiconductor chips are attached to a die pad. The dicing/die bonding integral film 1 includes a base film 3a, an adhesive layer 3b, and a bonding layer 2.

The base film 3a is a part supporting the semiconductor wafer during dicing. The base film 3a has a circular planar shape, and a diameter α1 of the base film 3a is greater than an inner diameter of an annular wafer ring used in dicing. The base film 3a may include, for example, a polytetrafluoroethylene film, a polyethylene terephthalate film, a film composed of polyvinyl acetate polyethylene copolymers, a polyethylene film, a polypropylene film, a polymethylpentene film, a plastic film such as polyvinyl chloride, and a laminated film thereof.

The adhesive layer 3b is a part to which the wafer ring is attached and fixed. The adhesive film 3b has a circular planar shape, and a diameter α1 of the adhesive layer 3b is greater than an inner diameter of an annular wafer ring used in dicing. For example, the adhesive layer 3b has a thickness ranging from about 1 μm to 50 μm. The adhesive layer 3b is of a pressure-sensitive type, for example, an adhesive layer of which a main component is acryl, rubber, silicone, polyurethane, polyester, or the like. Also, the pressure-sensitive adhesive layer is an adhesive layer that allows an adhered substance to be peeled without irradiation of energy rays. In the case where the adhesive layer 3b is of a pressure-sensitive type, hardly any variation in adhesive strength arises between regions.

The bonding layer 2 has a central portion to which a semiconductor wafer to be diced is concentrically bonded and is provided for bonding and attaching individually divided semiconductor chips to a die pad after dicing. A bonding agent included in the bonding layer 2 may be, for example, a thermosetting bonding agent such as an epoxy resin, a photocurable bonding agent, a thermoplastic bonding agent, or an oxygen-reactive bonding agent. The bonding layer 2 has a circular planar shape. The bonding layer 2 has an area greater than the semiconductor wafer. A layer thickness of the bonding layer 2 is, for example, in the range of about 1 µm to 250 µm. When the layer thickness of the bonding layer 2 is less than 1 µm, it is difficult to secure a sufficient bonding strength during die bonding; and when the layer thickness is greater than 250 µm, it is uneconomical and there is little advantage in terms of characteristics.

The bonding layer 2 has a diameter α2 which is greater than that of the semiconductor wafer, and a difference in diameter between the bonding layer 2 and the semiconductor wafer is greater than 20 mm and less than 35 mm. The inner diameter of the wafer ring for blade dicing should be large enough to allow a blade to not be in contact with the wafer ring during blade dicing. For this reason, the inner diameter of the wafer ring is, for example, greater than the diameter of the semiconductor wafer by 45 mm or more, and the bonding layer 2 is preferably of a size to ensure that it is contained inside a hole of the wafer ring. For example, when considering a positioning accuracy of a wafer ring placing device, it is preferable that the diameter of the bonding layer 2 is less than the inner diameter of the hole of the wafer ring by about 10 mm. The dicing/die bonding integral film 1 is expanded in a step of bonding and attaching individually divided semiconductor chips to a die pad after dicing. As the dicing/die bonding integral film 1 is expanded, a space between the semiconductor chips is broadened, making it possible to easily pick up the semiconductor chips. To sufficiently transfer the expansion stress, it is preferably that the bonding layer 2 has a diameter less than the inner diameter of the hole of the wafer ring by about 10 mm. Therefore, when a difference in diameter between the bonding layer 2 and the semiconductor wafer is less than 35 mm, the bonding layer 2 is surely contained inside the hole of the wafer ring, and the expansion stress can also be transferred sufficiently. In particular, when a difference in diameter between the bonding layer 2 and the semiconductor wafer is less than 32 mm, the bonding layer 2 is more surely contained inside the hole of the wafer ring, and the expansion stress can also be transferred more sufficiently.

For example, when the semiconductor wafer to be diced has a diameter of 8 inches (203 mm), and the wafer ring has an inner diameter of 248 mm, the diameter of the bonding layer 2 is, for example, not less than 223 mm but less than 248 mm, and preferably, not less than 228 mm but less than 238 mm. Also, for example, when the semiconductor wafer to be diced has a diameter of 12 inches (305 mm), and the wafer ring has an inner diameter of 350 mm, the diameter of the bonding layer 2 is, for example, not less than 325 mm but less than 350 mm, and preferably, not less than 330 mm but less than 340 mm.

The dicing/die bonding integral film 1 is configured by stacking the base film 3a, the adhesive layer 3b, and the bonding layer 2 in that order. That is, the adhesive layer 3b is formed on and in contact with the base film 3a, and the bonding layer 2 is formed on and in contact with the adhesive layer 3b. The base film 3a, adhesive layer 3b, and bonding layer 2 having circular planar shapes are stacked such that the centers of the respective circles overlap each other. Also, the base film 3a and adhesive layer 3b, and the bonding layer 2 are concentrically disposed. The base film 3a and the adhesive layer 3b have the same diameter α1, and the adhesive layer 3b has the same area as the base film 3a. The bonding layer 2 is smaller in area than each of the adhesive layer 3b and the base film 3a.

Figure 8:
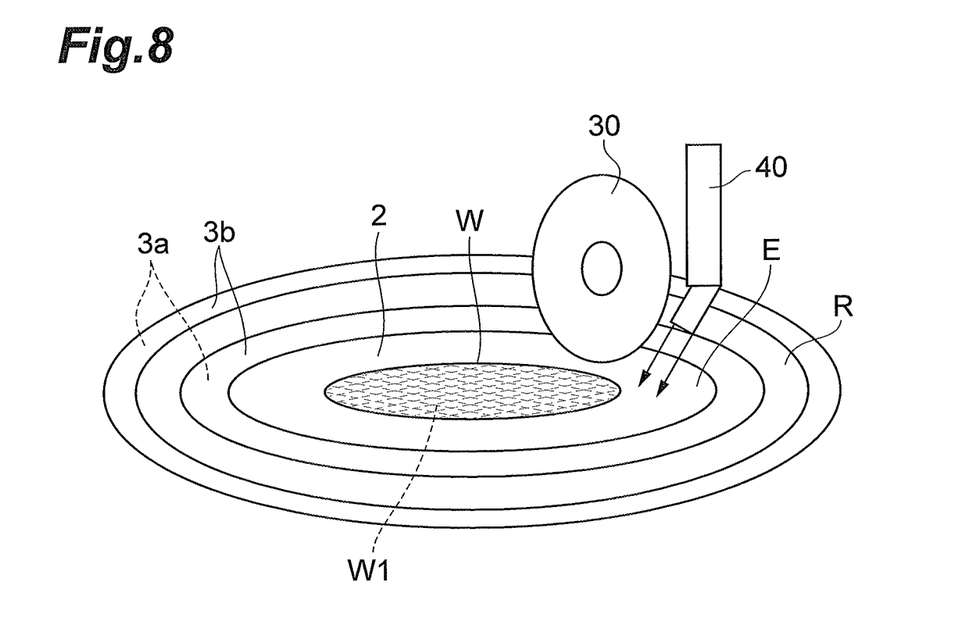
FIG. 8 is a view illustrating a state where dicing is performed using the dicing/die bonding integral film according to the present invention.

In the above-described dicing/die bonding integral film 1, a difference between the diameter α2 of the bonding layer 2 and the diameter of the semiconductor wafer is greater than 20 mm and less than 35 mm. When the semiconductor wafer is concentrically bonded to the central portion of the bonding layer 2 (that is, when the semiconductor wafer is attached to the bonding layer 2 such that their centers overlap each other), the peripheral edge of the bonding layer 2 exudes out from around the entire semiconductor wafer by 10 mm or more. Therefore, as illustrated in FIG. 8, cutting water, which is sprayed through a cutting water supply nozzle 40, is prevented from directly contacting a peripheral edge E of the bonding layer 2 when the semiconductor wafer is diced with a dicing blade 30 of a dicing device. Thus, it is possible to prevent the peeling of the peripheral edge E of the bonding layer 2 which is caused by the hydraulic pressure from the cutting water during dicing, thus preventing the contamination of the semiconductor wafer caused by the peeling of the bonding layer 2. Particularly, when a difference between the diameter α2 of the bonding layer 2 and the diameter of the semiconductor wafer is 25 mm or more, it is possible to more reliably prevent the peeling of the peripheral edge E of the bonding layer 2 which is caused by hydraulic pressure from the cutting water during dicing, and thus more reliably prevent the contamination of the semiconductor wafer caused by the peeling of the bonding layer 2. Herein, the peripheral edge E of the bonding layer 2 indicates an outer peripheral portion which is about 10 mm or less in distance from an edge of an outer periphery of the bonding layer 2.

Also, it is particularly preferable that the peripheral edge of the bonding layer 2 exudes out from around the entire the semiconductor wafer by 10 mm or more; however, there is no need for the peripheral edge to exude out from around the semiconductor wafer by a distance greater than 10 mm if it exudes out by 10 mm or more in a direction in which it is easily exposed to cutting water.

For cutting water, for example, a blade cooler, a shower, or a spray is standardly equipped. A supply pressure of each of the blade cooler, shower and spray is, for example, in the range of about 0.2 MPa to 0.6 MPa. A flow rate of each of the blade cooler, shower and spray is, for example, in the range of about 0.5 L/min. to 2.0 L/min.

Figure 10:
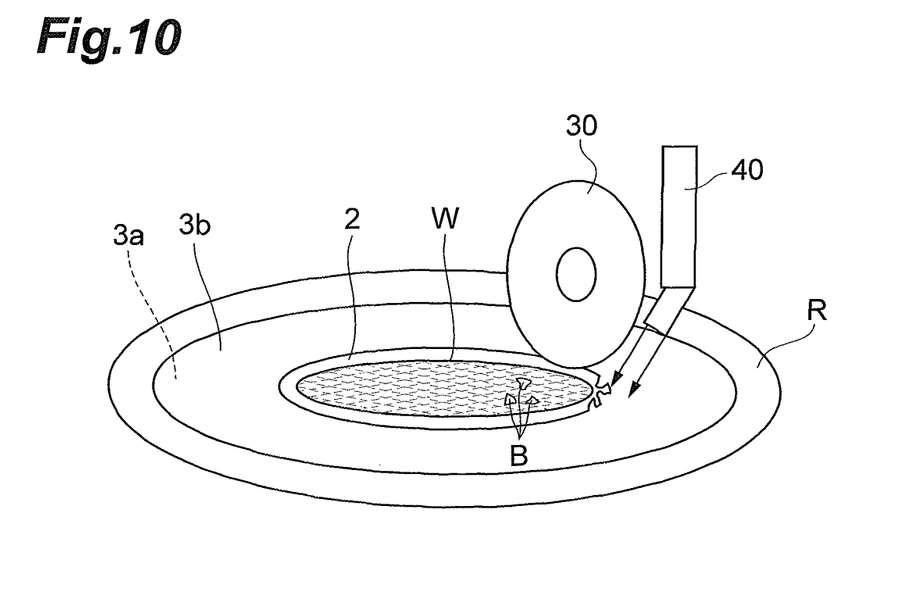
FIG. 10 is a view illustrating a state where dicing is performed using a conventional dicing/die bonding integral film.

On the other hand, as in the conventional dicing/die bonding integral film, if a difference between the diameter of the bonding layer 2 and the diameter of the semiconductor wafer is 20 mm or less, the peripheral edge of the bonding layer 2 exuding out from around the entire the semiconductor wafer is 10 mm or less in distance when the semiconductor wafer is concentrically bonded to the central portion of the bonding layer 2. In this case, as illustrated in FIG. 10, the cutting water is brought into direct contact with the peripheral edge E of the bonding layer 2 when the semiconductor wafer is diced with the dicing blade 30. Thus, the peeling of the peripheral edge E of the bonding layer 2 occurs, which is caused by hydraulic pressure from the cutting water during dicing, causing fragments B of the peeled bonding layer 2 to be adhered to the semiconductor wafer.

Furthermore, in the dicing/die-bonding integrated film 1, the diameter α1 of each of the base film 3a and adhesive layer 3b is greater than the inner diameter of the wafer ring to be used in dicing, and the diameter α2 of the bonding layer 2 is less than the inner diameter of the wafer ring, so that the wafer ring to be used in dicing can be easily bonded to the adhesive layer 3b stacked on the base film 3a.

The present invention is not limited to the dicing/die bonding integral film 1 as described above. For example, it is preferable that the bonding layer 2 has a planar shape similar to that of the semiconductor wafer, and, for example, has a shape such that a portion of an outer periphery of a circle may be straight. Alternatively, the planar shapes of the base film 3a and adhesive layer 3b may be other than the circular shape— for example, a rectangular shape. The diameter of the adhesive layer 3b is allowable as long it is greater than the inner diameter of the annular wafer ring to be used in dicing and may not be greater than the diameter of the base film 3a. In the case where the adhesive layer 3b is of a pressure-sensitive type, the significant effect of the present invention is particularly achieved; however, even in the case where the adhesive layer 3b is of a UV-type (which can change the adhesive strength by UV irradiation), the effect of the present invention can also be achieved. The bonding layer 2 and the adhesive layer 3b of the dicing/die bonding integral film 1 are preferably supported/protected by a peelable base. As the peelable base, a long sheet may be used, which has a width broader than the diameter of the semiconductor wafer to be bonded. The thickness of the peelable base may be appropriately selected within the range where workability is not diminished and, for example, may be in the range of about 1 μm to 1,000 μm. As the peelable base, a polyester-based film, a polyolefin-based film, a plastic film, or the like may be used.

Figure 3:
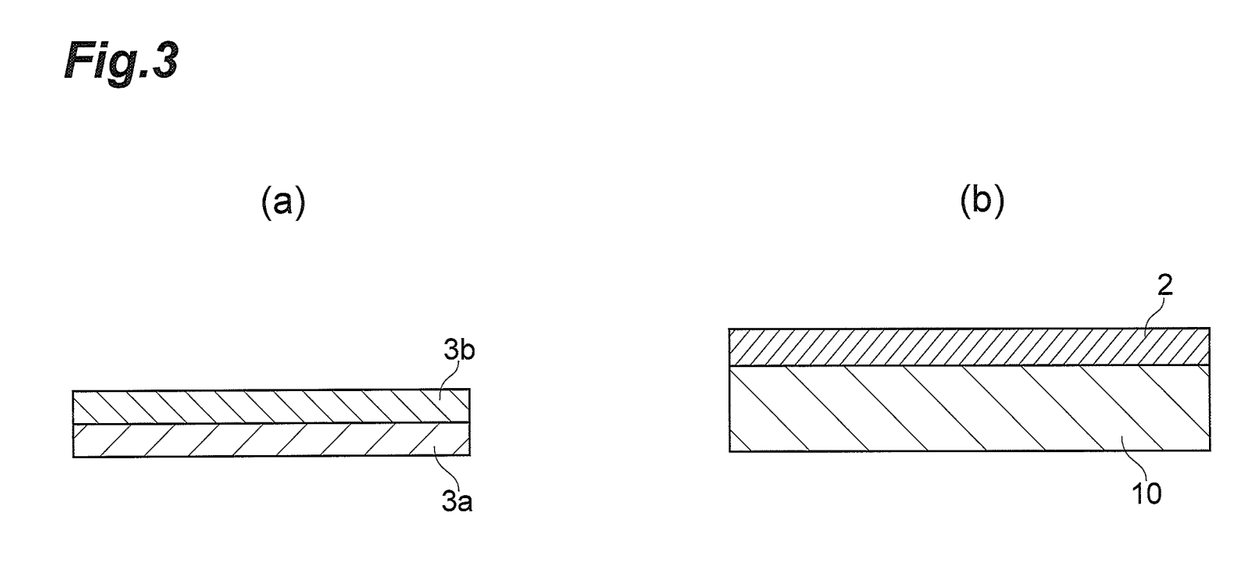
FIG. 3(a) is a view illustrating a dicing film.
FIG. 3(b) is a view illustrating a die bonding film.

One example of a method for manufacturing the dicing/die bonding integral film 1 will be described using FIGS. 3 to 5. First, as illustrated in FIG. 3(a), a dicing film in which an adhesive layer 3b is formed on a base film 3a is prepared (dicing film preparation step). Also, as illustrated in FIG. 3(b), a die bonding film in which a bonding layer 2 is formed on a peelable base 10 is prepared (die bonding film preparation step).

Figure 4:
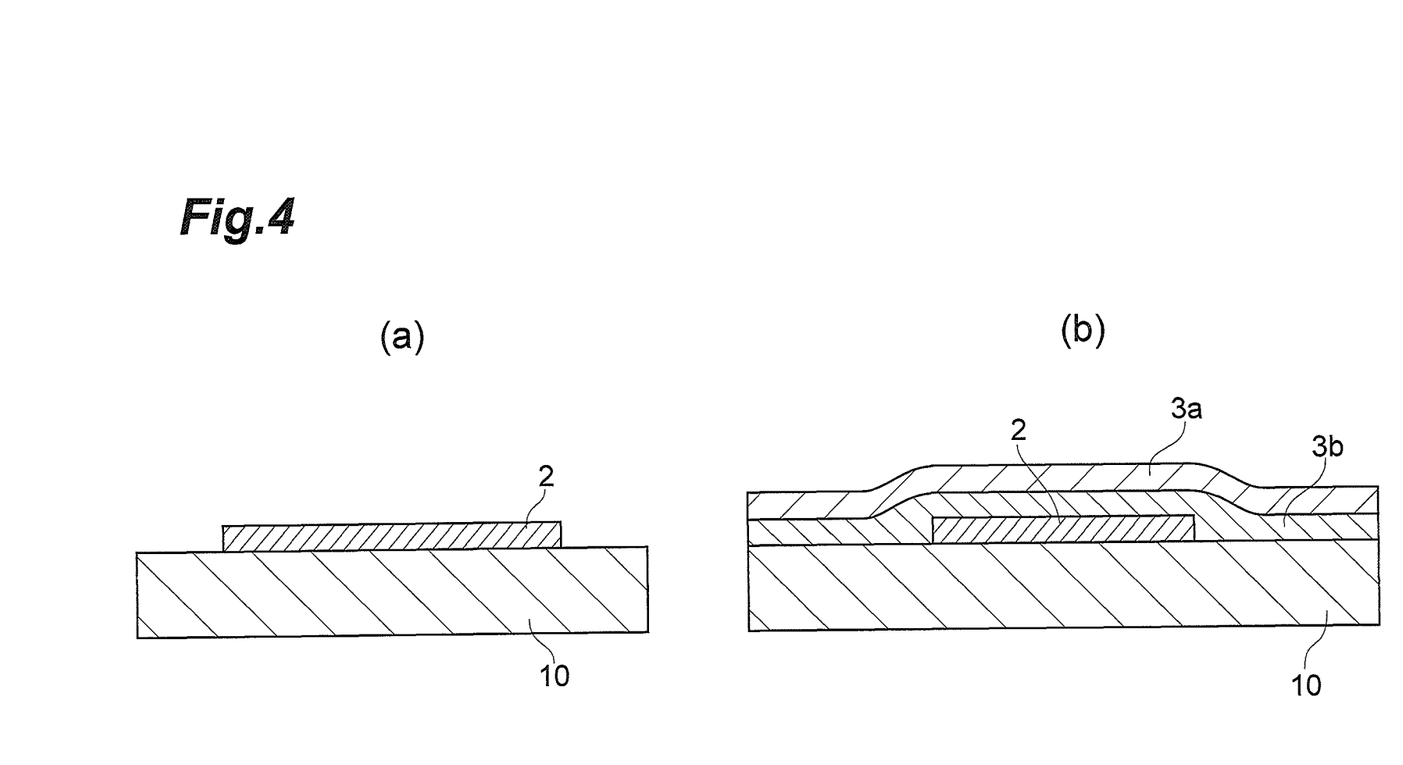
FIG. 4(a) is a view illustrating a pre-cut state of a bonding layer.
FIG. 4(b) is a view illustrating a state where a dicing film is bonded to a die bonding film.

Subsequently, as illustrated in FIG. 4(a), the bonding layer 2 is cut into a circular shape (bonding layer cutting step). In the bonding layer cutting step, the bonding layer 2 is cut such that the bonding layer 2 is greater in area than the semiconductor wafer concentrically bonded to a central portion thereof and is smaller in area than the adhesive layer 3b and the base film 3a. At this time, the bonding layer 2 is cut into a circular shape such that the diameter of the bonding layer 2 is greater than the diameter of the semiconductor wafer and less than the inner diameter of the wafer ring to be used in dicing, and a difference in diameter between the bonding layer 2 and the semiconductor wafer is greater than 20 mm and less than 35 mm.

Thereafter, as illustrated in FIG. 4(b), a side of the dicing film where the adhesive layer 3b is formed is bonded to the peelable base 10 and the bonding layer 2 cut into the circular shape (film bonding step). Accordingly, the dicing film and the die bonding film are integrated.

Figure 5:
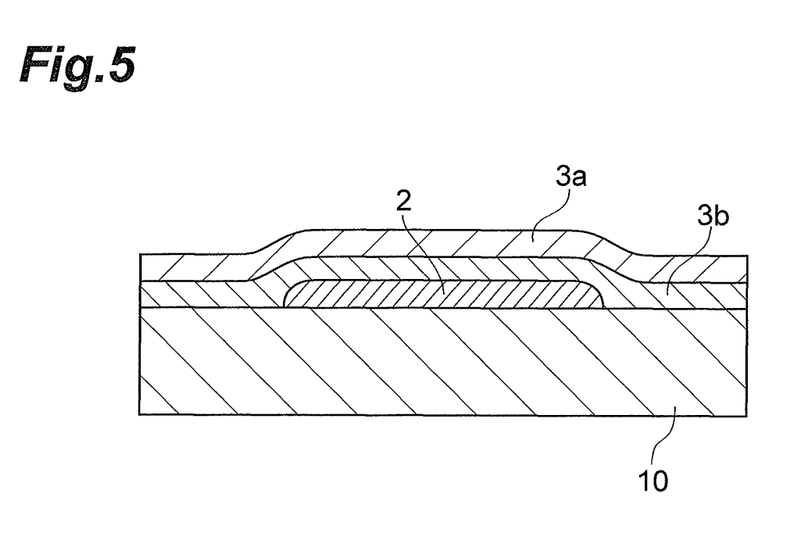
FIG. 5 is a view illustrating a state where a base film and an adhesive layer are pre-cut.

After the film bonding step, the base film 3a and the adhesive layer 3b are cut into a circular shape (base film and adhesive layer cutting step). In the base film and adhesive layer cutting step, the base film 3a and the adhesive layer 3b are cut into a circular shape such that the diameter of each of the base film 3a and the adhesive layer 3b becomes greater than the inner diameter of the wafer ring to be used in dicing. Alternatively, the base film and adhesive layer cutting step may be omitted if the planar shapes of the base film 3a and the adhesive layer 3b are already larger than the wafer ring.

According to the method for manufacturing the dicing/die bonding integral film 1, a difference between the diameter α2 of the bonding layer 2 and the diameter of the semiconductor wafer is greater than 20 mm and less than 35 mm. Thus, as described above, the direct contact of cutting water with the peripheral edge E of the bonding layer 2 is prevented when the semiconductor wafer is diced with a dicing blade. Therefore, it is possible to prevent the peeling of the peripheral edge E of the bonding layer 2 which is caused by the load or hydraulic pressure from the cutting water during dicing.

Figure 6:
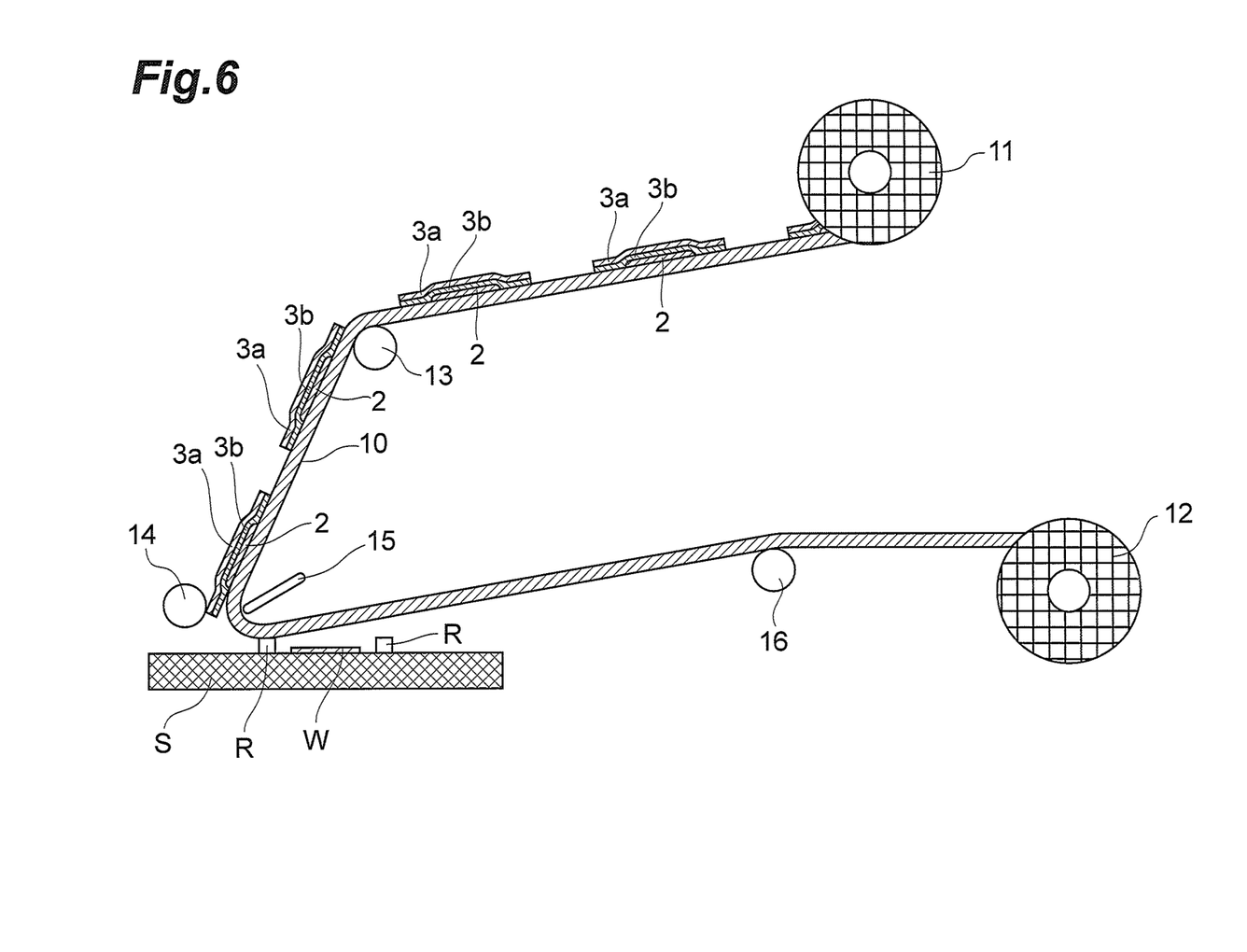
FIG. 6 is a view illustrating a semiconductor wafer bonding process.

Hereinafter, one example of a method for manufacturing a semiconductor chip according to the present invention will be described. First, the dicing/die bonding integral film 1 manufactured by the method for manufacturing the dicing/die bonding integral film 1 is prepared (preparation step). In this example, the dicing/die bonding integral film 1, in which the bonding layer 2, the adhesive layer 3b and the base film 3a are formed on the long peelable base 10, is used. At first, the dicing/die bonding integral film 1 is wound around a delivering device 11 as illustrated in FIG. 6.

After the preparation step, the peelable base 10 is peeled off (base peeling step). Afterwards, a semiconductor wafer W is concentrically bonded to a central portion of the bonding layer 2 which is exposed by peeling the peelable base 10 (semiconductor wafer bonding step). Accordingly, the peripheral edge of the bonding layer 2 exudes out from around the entire the semiconductor wafer W by 10 mm or more. Also, it is particularly preferable that the peripheral edge of the bonding layer 2 exudes out from around the entire the semiconductor wafer by 10 mm or more; however, there is no need for the peripheral edge to exude out from around the entire the semiconductor wafer by a distance greater than 10 mm if it exudes out by 10 mm or more in a direction in which it is easily exposed to cutting water. Subsequently, a wafer ring R is bonded to the adhesive layer 3b outside the peripheral edge of the bonding layer 2 (wafer ring bonding step).

Figure 7:
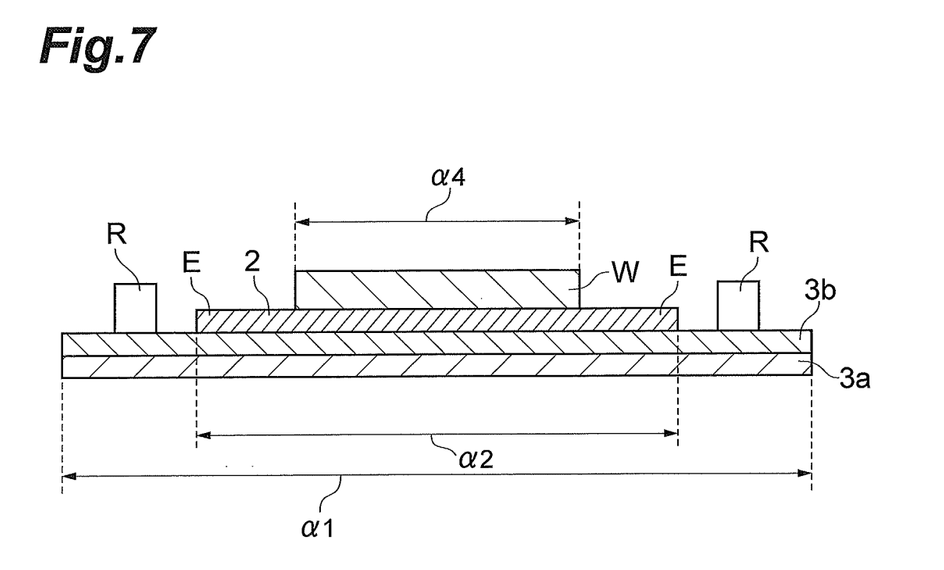
FIG. 7 is a view illustrating a state where a semiconductor wafer is attached onto a bonding layer.

Specifically, the dicing/die bonding integral film 1 is fed from the delivery device 11 first by a feeding roller 13, and the peelable base 10 is then peeled by a separation plate 15. Thus, the bonding layer 2, the adhesive layer 3b and the base film 3a are separated from the peelable base 10. The separated bonding layer 2, adhesive layer 3b and base film 3a are pressurized and attached to the semiconductor wafer W and the wafer ring R on a stage S by a pressure roller 14. Resultantly, as illustrated in FIG. 7, the semiconductor wafer W is bonded to the bonding layer 2, and the wafer ring R is bonded to the adhesive layer 3b. Also, the peeled peelable base 10 is wound onto a winding device 12 by a winding roller 16.

Next, as illustrated in FIG. 8, the semiconductor wafer W bonded to the bonding layer 2 is diced to obtain a plurality of semiconductor chips W1 which are individually divided (chip obtaining step). During dicing, cutting water is sprayed onto a dicing blade 30 and the semiconductor wafer W through a cutting water supply nozzle 40 of a dicing device. By means of the cutting water, the frictional heat between the semiconductor wafer W and the dicing blade 30 is reduced, and cut residues of the semiconductor wafer W are also cleaned and removed.

During the dicing, for the cutting water, each of the blade cooler, shower and spray which are standardly equipped has a supply pressure ranging from about 0.2 MPa to 0.6 MPa and a flow rate ranging from about 0.5 L/min to 2.0 L/min.

Figure 9:
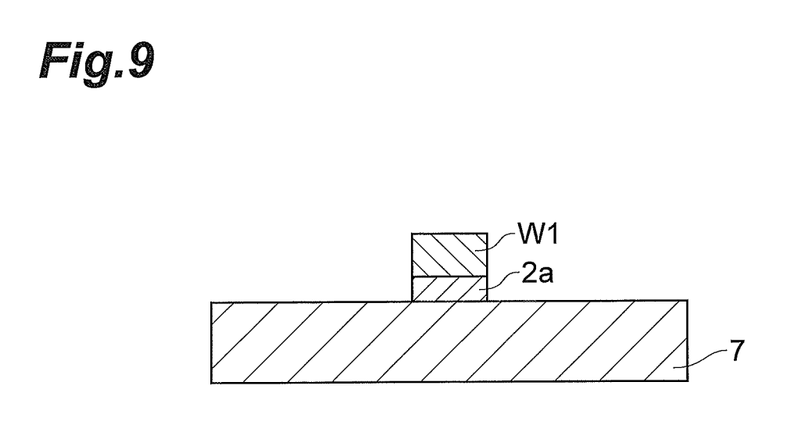
FIG. 9 is a view illustrating a state where individually divided semiconductor chips are mounted on a die pad.

Thereafter, the individually divided semiconductor chips W1 are picked up, and then, as illustrated in FIG. 9, mounted on a die pad 7 with the bonding layer 2a interposed therebetween (die bonding step). Next, the semiconductor chip W1 on the die pad 7 is connected to a lead of a lead frame (wire bonding step). Finally, the lead frame on which the semiconductor chip W1 is mounted is molded using a resin or the like (molding step).

As described above, according to the method for manufacturing the semiconductor chip, a difference between the diameter α2 of the bonding layer 2 and the diameter of the semiconductor wafer W is greater than 20 mm and less than 35 mm. Thus, as described above, the direct contact of cutting water with the peripheral edge E of the bonding layer 2 is prevented when the semiconductor wafer W is diced with the dicing blade 30. Therefore, it is possible to prevent the peeling of the peripheral edge E of the bonding layer 2 which is caused by hydraulic pressure from the cutting water during dicing. Consequently, it is possible to obtain the semiconductor chip W1 with little contamination caused by the bonding layer 2.

Hereinafter, Examples 1 to 8 and Comparative Examples 1 and 2 will be described; however, the present invention is not limited to the examples below.

Example 1

Example 1 illustrates an example of using a silicon wafer having a thickness of 75 μm and a diameter of 203 mm (8 inches), and a wafer ring having a diameter of 248 mm or more. First, a dicing film having a width of 300 mm (e.g., SD-3001 series manufactured by Hitachi Chemical Co., Ltd.), in which an adhesive layer was formed on a base film, was prepared. Also, a die bonding film (e.g., FH-900 series manufactured by Hitachi Chemical Co., Ltd.), in which a bonding layer was formed on a peelable base, was prepared.

Subsequently, the bonding layer was pre-cut (previously cut) such that the planar shape of the bonding layer of the die bonding film became circular, with a 223 mm diameter. At this time, the bonding layer was pre-cut such that the bonding layer was greater in area than the silicon wafer to be diced and smaller in area than the adhesive layer and the base film.

Subsequently, a side of the dicing film, at which the adhesive layer was formed, was bonded to the peelable base and the pre-cut bonding layer. Thereafter, the base film and the adhesive layer were pre-cut (previously cut) such that the planar shapes of the base film and the adhesive layer became circular, with a 270 mm diameter, thereby obtaining a dicing/die bonding integral film. At this time, the circular base film and adhesive layer and the circular bonding layer were concentrically disposed.

Next, the peelable base of the dicing/die bonding integral film was peeled, and a silicon wafer was laminated on the exposed bonding layer. Also, the wafer ring was fixed to the adhesive layer. In such a state, the silicon wafer was diced using a dicing blade (e.g., full auto dicer DFD-6361 manufactured by DISCO Corporation) while cutting water was being sprayed. The dicing was performed in a step cutting manner where the process was performed using two different dicing blades in sequence. The dicing blade, NBC-ZH204J-SE 27HDDD manufactured by DISCO Corporation was used as a first thick dicing blade, and the dicing blade, NBC-ZH127F-SE 27HDBB manufactured by DISCO Corporation was used as a second thin dicing blade. The number of revolutions of the blade was 40,000 rpm, and the cutting speed was 30 mm/second. Also, a transfer pitch of the blade—that is, the dicing space during the cutting of the silicon wafer was 5 mm. During the dicing, for the cutting water, a supply pressure of each of the blade cooler, shower and spray, which were standardly equipped, was about 0.4 MPa, and the flow rate for the blade cooler, shower and spray were 1.5 L/min, 1.0 L/min and 1.0 L/min, respectively.

Examples 2-8

Examples 2 to 8 were carried out under the same conditions as Example 1 except that the bonding layers of the die bonding film had diameters of 225 mm, 228 mm, 230 mm, 233 mm, 235 mm, 238 mm, and 240 mm, respectively.

Comparative Example 1

Comparative Example(C. Ex.) 1 was carried out under the same conditions as Example 1 except that the bonding layer of the die bonding film had a diameter of 220 mm.

Examples 9-16

Example 9 was carried out under the same conditions as Example 1 except that a silicon wafer having a thickness of 75 μm and a diameter of 305 mm (12 inches), a wafer ring having a diameter of 350 mm or more, and a dicing film having a width of 400 mm were used, and the bonding layers of the die bonding film had diameters of 325 mm, 327 mm, 330 mm, 332 mm, 335 mm, 337 mm, 340 mm, and 342 mm, respectively.

Comparative Example 2

Comparative Example (C. Ex.) 2 was carried out under the same conditions as Example 1 except that a silicon wafer having a thickness of 75 μm and a diameter of 305 mm (12 inches), a wafer ring having a diameter of 350 mm or more, and a dicing film having a width of 400 mm were used, and the bonding layer of the die bonding film had a diameter of 320 mm.

(Assessment)

As an assessment method, the amount of an edge portion of the bonding layer of the dicing/die bonding integral film which was peeled from the adhesive layer by cutting water was observed. The peeling of the edge portion of the bonding layer was observed by visual inspection. The results are shown in Tables 1 and 2. The example where there was no peeling when the silicon wafer was diced with 80 lines by a dicing blade is indicated as ○; and the example where there was peeling is indicated as X.

TABLE 1

| 8-inch silicon wafer | C. Ex. 1 | Ex. 1 | Ex. 2 | Ex. 3 | Ex. 4 | Ex. 5 | Ex. 6 | Ex. 7 | Ex. 8 |
|---|---|---|---|---|---|---|---|---|---|
| Diameter of bonding layer (mm) | 220 | 223 | 225 | 228 | 230 | 233 | 235 | 238 | 240 |
| Peeled result of edge portion of bonding layer | x | ○ | ○ | ○ | ○ | ○ | ○ | ○ | ○ |

TABLE 1-continued

| 8-inch silicon wafer | C. Ex. 1 | Ex. 1 | Ex. 2 | Ex. 3 | Ex. 4 | Ex. 5 | Ex. 6 | Ex. 7 | Ex. 8 |
|---|---|---|---|---|---|---|---|---|---|
| Diameter difference between wafer and bonding layer | 17 mm | 20 mm | 22 mm | 25 mm | 27 mm | 30 mm | 32 mm | 35 mm | 37 mm |

TABLE 2

| 8-inch silicon wafer | C. Ex. 2 | Ex. 9 | Ex. 10 | Ex. 11 | Ex. 12 | Ex. 13 | Ex. 14 | Ex. 15 | Ex. 16 |
|---|---|---|---|---|---|---|---|---|---|
| Diameter of bonding layer (mm) | 320 | 325 | 327 | 330 | 332 | 335 | 337 | 340 | 342 |
| Peeled result of edge portion of bonding layer | x | ○ | ○ | ○ | ○ | ○ | ○ | ○ | ○ |
| Diameter difference between wafer and bonding layer | 17 mm | 20 mm | 22 mm | 25 mm | 27 mm | 30 mm | 32 mm | 35 mm | 37 mm |

According to Tables 1 and 2, while the peeling of the edge portion of the bonding layer was observed in Comparative Examples 1 and 2, the peeling phenomenon of the edge portion of the bonding layer was not observed in Examples 1-16, and the results were good. From the above, it was found that in order to prevent the peripheral edge of the bonding layer of the dicing/die bonding integral film from being peeled from the adhesive layer due to the cutting water during dicing, a difference in diameter between the bonding layer and the semiconductor wafer should become greater than 20 mm in the case where the semiconductor wafer is concentrically bonded to the central portion of the bonding layer.

INDUSTRIAL APPLICABILITY

According to the present invention, it is possible to provide a dicing/die bonding integral film for preventing a peripheral edge of a bonding layer from being peeled from an adhesive layer during a dicing process of a semiconductor wafer, a dicing/die bonding integral film manufacturing method, and a semiconductor chip manufacturing method.

REFERENCE SIGNS LIST

1: dicing/die binding integral film, 2/2a: bonding layer, 3a: base film, 3b: adhesive layer, 7: die pad, 10: peelable base, E: peripheral edge, W: semiconductor wafer, W1: semiconductor chip, R: wafer ring

The invention claimed is:
1. A dicing/die bonding integral film, comprising:
a base film;
a pressure-sensitive adhesive layer which is formed on the base film and to which a wafer ring to be used in blade dicing is bonded; and
a bonding layer formed on the adhesive layer and having a central portion to which a semiconductor wafer to be subjected to blade dicing is bonded,
wherein a planar shape of the bonding layer is circular,
an area of the bonding layer is greater than an area of the semiconductor wafer and smaller than an area of each of the base film and the adhesive layer, and
a diameter of the bonding layer is greater than a diameter of the semiconductor wafer and less than an inner diameter of the wafer ring, and a difference in diameter between the bonding layer and the semiconductor wafer is greater than 20 mm, such that cutting water, sprayed onto a dicing blade during blade dicing the semiconductor wafer, is prevented from directly contacting a peripheral edge of the bonding layer, and less than 35 mm.

2. A dicing/die bonding integral film manufacturing method, comprising:
a dicing film preparation step of preparing a dicing film in which an adhesive layer is formed on a base film;
a die bonding film preparation step of preparing a die bonding film in which a bonding layer is formed on a peelable base;
a bonding layer cutting step of cutting the bonding layer into a circular shape such that an area of the bonding layer is greater than an area of a semiconductor wafer bonded to a central portion of the bonding layer and is smaller than an area of each of the adhesive layer and the base film; and
a film bonding step of bonding a side of the dicing film, at which the adhesive layer is formed, to the peelable base of the die-bonding film and the bonding layer cut into the circular shape,
wherein, in the bonding layer cutting step,
the bonding layer is cut such that a diameter of the bonding layer is greater than a diameter of the semiconductor wafer and less than an inner diameter of a wafer ring to be used in blade dicing, and a difference in diameter between the bonding layer and the semiconductor wafer is greater than 20 mm, such that cutting water, sprayed onto a dicing blade during blade dicing the semiconductor wafer, is prevented from directly contacting a peripheral edge of the bonding layer, and less than 35 mm.

3. The dicing/die bonding integral film manufacturing method of claim 2, wherein, in the dicing film preparation step, a dicing film in which a pressure-sensitive adhesive layer is formed on a base film is prepared.

4. A semiconductor chip manufacturing method, comprising:
- a semiconductor wafer bonding step of bonding a semiconductor wafer to a bonding layer of a dicing/die bonding integral film in which an adhesive layer is formed on a base film and the bonding layer is formed on the adhesive layer, such that a peripheral edge of the bonding layer exudes out from around the entire semiconductor wafer by 10 mm or more, so that cutting water, sprayed onto a blade during dicing the semiconductor wafer, is prevented from directly contacting the peripheral edge of the bonding layer;
- a wafer ring bonding step of bonding a wafer ring to the adhesive layer outside the peripheral edge of the bonding layer; and
- a chip obtaining step of obtaining a plurality of semiconductor chips which are individually divided by dicing the semiconductor wafer with the blade.

5. The dicing/die bonding integral film according to claim 1, wherein the difference in diameter between the bonding layer and the semiconductor wafer is less than 35 mm so that the bonding layer can be contained within a hole in the wafer ring.

6. The dicing/die bonding integral film according to claim 1, wherein the base film has a diameter greater than the inner diameter of the wafer ring.

7. The dicing/die bonding integral film according to claim 1, wherein the inner diameter of the wafer ring is greater than the diameter of the semiconductor wafer by at least 45 mm.

8. The dicing/die bonding integral film manufacturing method according to claim 2, wherein the difference in diameter between the bonding layer and the semiconductor wafer is less than 35 mm so that the bonding layer can be contained within a hole in the wafer ring.

9. The dicing/die bonding integral film manufacturing method according to claim 2, wherein the base film has a diameter greater than the inner diameter of the wafer ring.

10. The dicing/die bonding integral film manufacturing method according to claim 2, wherein the inner diameter of the wafer ring is greater than the diameter of the semiconductor wafer by at least 45 mm.

* * * * *